United States Patent [19]

Clendening et al.

[11] 4,366,394
[45] Dec. 28, 1982

[54] DIVIDE BY THREE CLOCK DIVIDER WITH SYMMETRICAL OUTPUT

[75] Inventors: Steven J. Clendening, Plano; Tello D. Adams, Richardson, both of Tex.

[73] Assignee: Rockwell International Corporation, El Segundo, Calif.

[21] Appl. No.: 190,683

[22] Filed: Sep. 25, 1980

[51] Int. Cl.[3] .................. H03K 2/36; H03K 21/06
[52] U.S. Cl. .................. 307/225 R; 328/41; 307/224 R
[58] Field of Search .............. 328/39, 41; 307/225 R, 307/445

[56] References Cited

U.S. PATENT DOCUMENTS

| | | | |
|---|---|---|---|
| 3,439,278 | 4/1969 | Farrow | 307/225 R |
| 3,473,129 | 10/1969 | Tschannen | 328/39 |
| 3,571,728 | 3/1971 | Andrea et al. | 328/41 |
| 3,902,125 | 8/1975 | Oliva | 328/39 |
| 3,943,379 | 3/1976 | McGuffin | 307/225 R |
| 4,041,403 | 8/1977 | Chiapparoli | 328/39 |

*Primary Examiner*—John S. Heyman
*Attorney, Agent, or Firm*—Michael E. Taken; Bruce C. Lutz; Howard R. Greenberg

[57] ABSTRACT

A flip-flop receives clock pulses of frequency F and is alternately set and reset on alternate inverted third clock pulse edges by logic responsive to the clock pulses and to the output of the flip-flop. The logic includes a second flip-flop and a pair of gates which maintain the set and reset states of the first flip-flop for two consecutive clock pulse edges between set and reset transitions to provide symmetrical output pulses from the first flip-flop of frequency 1/3F with a substantially 50% duty cycle.

9 Claims, 2 Drawing Figures

DIVIDE BY THREE CLOCK DIVIDER WITH SYMMETRICAL OUTPUT

TECHNICAL FIELD

The invention relates to digital clock dividers.

BACKGROUND

The present invention arose in conjunction with the development of a multiplexer wherein three digital streams were multiplexed together onto a single high speed line. At the demultiplexed end, a synchronous one-third rate clock was needed to demultiplex the high speed data into three streams at one-third the high speed rate. The high speed clock was symmetric, and the divide by three divider circuit also had to have a symmetric output. That is, the output had to have a 50% duty cycle, with the output clock signal having a high state 50% of the time, and a low state the remaining 50% of the time.

Divide by three digital clock dividers are known, but do not have a symmetric output. One alternative is to generate a signal of twice the clock rate frequency and then perform a divide by six operation. This alternative is objectionable however because it requires too much hardware and logic operation, particularly at the higher, doubled rate. Another alternative is the use of a phase locked loop operating at one-third the fundamental frequency of the clock. This is basically an analog technique, however, and would require a large amount of hardware.

SUMMARY

The invention provides an all digital clock divider circuit which receives clock pulses of frequency F, divides by three, and outputs symmetrical pulses of frequency $\frac{1}{3}$F. Every third clock edge is used to control a flip-flop. A given clock edge sets the flip-flop, the next two edges are bypassed, and the third inverted edge resets the flip-flop. The set and reset states of the flip-flop are maintained for two consecutive clock pulse edges between set and reset transitions on the alternate third inverted clock pulse edges.

The circuit includes logic responsive to the clock pulses of frequency F and to the output of the flip-flop for resetting the flip-flop every sixth clock pulse edge and for setting the flip-flop every third clock pulse edge following a reset clock pulse edge such that the flip-flop is set every sixth clock pulse edge symmetrically interleaved with resetting.

DETAILED DESCRIPTION

Figure 1:
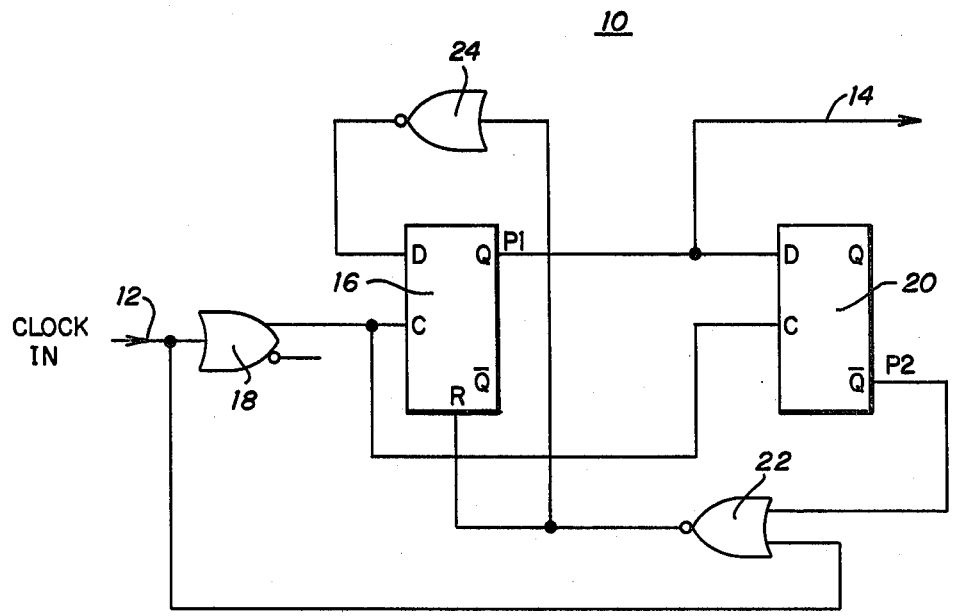
FIG. 1 is a circuit diagram of a divider circuit constructed in accordance with the invention.

FIG. 1 shows a divide by three digital clock divider circuit 10. The circuit receives symmetrical input clock pulses of frequency F at input 12 and delivers symmetrical output pulses of frequency $\frac{1}{3}$F at output 14. Flip-flop 16 receives the input clock pulses at its clock input, which pulses may be delivered through a delay gate such as 18 if desired. Means including a second flip-flop 20 and gates 22 and 24 are provided for alternately setting and resetting flip-flop 16 every one and one-half clock pulses on alternate inverted third clock pulse edges.

Flip-flops 16 and 20 are type D flip-flops, and are concurrently clocked by the input clock pulses of frequency F. The Q output of flip-flop 16 is connected to the D input of flip-flop 20. The $\overline{Q}$ output of flip-flop 20 is connected to an input of NOR gate 22. The other input of NOR gate 22 receives clock pulses from input 12. The output of gate 22 is connected to the R (reset) input of flip-flop 16 for providing a reset signal thereto. The output of gate 22 is also connected through inverter gate 24 to the D input of flip-flop 16 to provide a set signal thereto when clocked.

Figure 2:
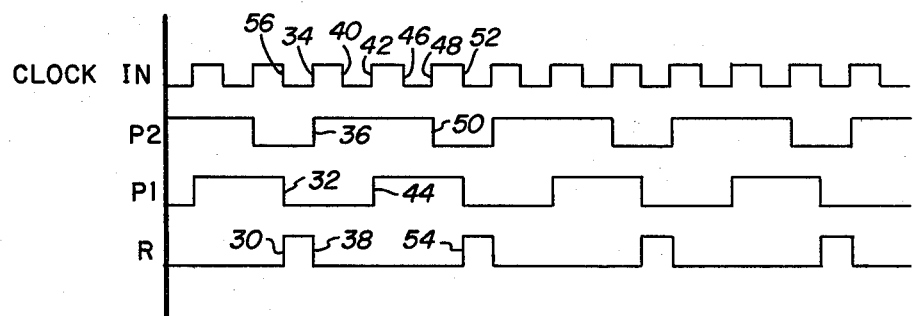
FIG. 2 is a timing diagram illustrating operation of the circuit of FIG. 1.

Referring to FIG. 2, the signal pulse stream from the Q output of flip-flop 16, which also appears on output 14, is designated $P_1$. The signal pulse stream from the $\overline{Q}$ of flip-flop 20 is designated $P_2$. The signal pulse stream output from gate 22 is designated R. As illustrated by $P_1$ in FIG. 2, flip-flop 16 is alternately set and reset every one and one-half clock pulses on alternate inverted third clock pulse edges. The set and reset states of flip-flop 16 are maintained for two consecutive clock pulse edges between set and reset transitions on said alternate third inverted clock pulse edges. This provides symmetrical output pulses $P_1$ of frequency $\frac{1}{3}$F with a substantially 50% duty cycle.

Referring in more detail to FIG. 2, the reset signal at 30 causes the Q output of flip-flop 16 to go low as shown at 32 in the $P_1$ pulse stream. At the next clock pulse edge 34, the low state of $P_1$ presented at the D input of flip-flop 20 is clocked therethrough such that the $\overline{Q}$ output of flip-flop 20 goes high as shown at 36 in the $P_2$ pulse stream. The output of gate 22 goes low as shown at 38 in the R pulse stream. Gate 24 inverts this low state of the R pulse stream to present a high state to the D input of flip-flop 16. The next clock pulse edge 40 effects no change. The next clock pulse edge 42 clocks the D input of flip-flop 16 through to its Q output such that the $P_1$ pulse stream goes high as shown at 44. The $\overline{Q}$ of flip-flop 20 is not changed by clock pulse edge 42 because the signal presented at the D input of flip-flop 20 ($P_1$) was low at the time of pulse edge 42 and hence this low state is clocked through flip-flop 20 by clock pulse edge 42 such that the $\overline{Q}$ output of flip-flop 20 ($P_2$) remains high. The next clock pulse edge 46 effects no change. The next clock pulse edge 48 is rising and clocks the high state at the D input of flip-flop 20 ($P_1$) therethrough such that the $\overline{Q}$ output of flip-flop 20 goes low as shown at 50 in pulse stream $P_2$. The Q output of flip-flop 16 ($P_1$) does not change at clock pulse edge 48 because the R signal remains low and hence the D input to flip-flop 16 remains high. The next clock pulse edge 52 causes the output of gate 22 to go high as shown at 54 in the R pulse stream because both $P_2$ and the clock signal from input 12 are low, whereby the output of gate 22 goes high. This resets flip-flop 16 causing its Q output ($P_1$) to go low, and repeat the cycle just described.

As seen in FIG. 2, the output pulses $P_1$ have a frequency of $\frac{1}{3}$F and are symmetrical with a substantially 50% duty cycle. The logic provided by flip-flop 20 and gates 22 and 24 responds to both the input clock pulses and to the output of flip-flop 16 for resetting flip-flop 16 every sixth clock pulse edge and for setting flip-flop 16 every third clock pulse edge following a reset clock pulse edge such that flip-flop 16 is set every sixth clock pulse edge symmetrically interleaved with resetting.

The gate means provided by gates 22 and 24 receive the input clock pulses and the output of the second flip-flop 20, and outputs the reset signal to the R input of flip-flop 16 and outputs a set signal to the D input of flip-flop 16 for clocking therethrough by the clock pulses. The gate means provided by gates 22 and 24 thus deliver alternate control signals to flip-flop 16 at every third clock pulse edge for alternately setting and resetting flip-flop 16 on alternate inverted third clock pulse edges such that flip-flop 16 outputs symmetrical pulses of frequency ⅓F with a substantially 50% duty cycle.

The $\overline{Q}$ output of flip-flop 20 (P₂) delivers pulses also of frequency ⅓F but with a substantially 67% duty cycle. The reset control signal R is provided at a frequency ⅓F with a substantially 17% duty cycle. The trailing edge 38 terminating the duty portion of a cycle of the reset control signal R coincides with the leading pulse edge 36 initiating the duty portion of a cycle of the signal P₂ from the $\overline{Q}$ output of the second flip-flop 20. The leading pulse edge 30 initiating the duty portion of a cycle of the reset control signal R coincides with the trailing pulse edge 32 terminating the duty portion of a cycle of the signal P₁ from the Q output of the first flip-flop 16. Pulse edges 30 and 32 are further coincident with a clock pulse edge of negative-going polarity as shown at 56. Pulse edges 38 and 36 are further coincident with the clock pulse edge 34 immediately following clock pulse edge 40 and of opposite polarity (positive-going), such that the next leading pulse edge 44 from the Q output of flip-flop 16 (P₁) initiating the duty portion of the next cycle therefrom is coincident with the next clock pulse edge of said opposite polarity (positive-going as shown at 42).

It is thus seen that the reset state of flip-flop 16 (P₁ low) is maintained for two consecutive clock pulse edges 34 and 40 between the reset and set transitions 30 and 44 on alternate third inverted clock pulse edges 56 and 42. Circuit 10 thus performs a divide by three operation on the input clock pulses of frequency F to deliver at output 14 output pulses of frequency ⅓F which are symmetrical.

Circuit 10 may be used in any system requiring a divide by three circuit. The circuit may be implemented using any integrated circuit family, depending upon the frequency at which the divide operation is required to operate. In one system, a symmetrical output at 14 with a 50%±5% duty cycle was desired from a 90 MHz input clock at 12. Circuit 10 easily satisfied these requirements. In another implementation using ECL type integrated circuits, circuit 10 provided a duty cycle of 51% at output 14 from a 103 MHz input at 12.

It is recognized that various modifications are possible within the scope of the appended claims.

We claim:

1. A divide by three digital clock divider circuit providing a symmetrical output, comprising:
   flip-flop means for receiving clock pulses of frequency F; and
   second means for alternately setting and resetting said flip-flop means on alternate inverted third clock pulse edges, and for maintaining the set and reset states of said flip-flop means for two consecutive clock pulse edges between set and reset transitions on said alternate third inverted clock pulse edges to provide symmetrical output pulses of frequency ⅓F with a substantially 50% duty cycle,
   said second means comprising logic means responsive directly to said clock pulses and to the output of said first flip-flop means for resetting said first flip-flop means every sixth clock pulse edge and for setting said first flip-flop means every third clock pulse edge following a reset clock pulse edge such that said flip-flop means is set every sixth clock pulse edge symmetrically interleaved with said resetting.

2. A divide by three digital clock divider circuit providing a symmetrical output, comprising:
   first flip-flop means for receiving clock pulses of frequency F; and
   second means for alternately setting and resetting said flip-flop means on alternate inverted third clock pulse edges, and for maintaining the set and reset states of said flip-flop means for two consecutive clock pulse edges between set and reset transitions on said alternate third inverted clock pulse edges to provide symmetrical output pulses of frequency ⅓F with a substantially 50% duty cycle,
   said second means comprising logic means responsive to said clock pulses and to the output of said first flip-flop means for resetting said first flip-flop means every sixth clock pulse edge and for setting said first flip-flop means every third clock pulse edge following a reset clock pulse edge such that said flip-flop means is set every sixth clock pulse edge symmetrically interleaved with said resetting wherein,
   second flip-flop means receives said clock pulses and the output of said first mentioned flip-flop means, and
   gate means receives said clock pulses and the output of said second flip-flop means, and outputs a reset signal to a reset input of said first flip-flop means, and outputs a set signal to a data input of said first flip-flop means for clocking therethrough by said clock pulses.

3. The invention according to claim 2 wherein:
   said first and second flip-flop means comprise first and second type D flip-flops each receiving said clock pulses at its C input;
   the output of said first flip-flop is connected to the D input of said second flip-flop;
   the output of said second flip-flop is connected to said gate means;
   the output of said gate means is connected to the R input and to the D input of said first flip-flop; and
   the output of said first flip-flop provides said symmetrical output pulses of frequency ⅓F.

4. The invention according to claim 3 wherein:
   the Q output of said first flip-flop is connected to the D input of said second flip-flop;
   the $\overline{Q}$ output of said second flip-flop is connected to said gate means;
   said gate means comprises a NOR gate receiving said clock pulses and said $\overline{Q}$ output of said second flip-flop;
   the output of said NOR gate is connected to the R input of said first flip-flop; and
   the output of said NOR gate is connected through an inverter to the D input of said first flip-flop.

5. A divide by three digital clock divider circuit providing a symmetrical output, comprising:
   a pair of flip-flops concurrently clocked by clock pulses of frequency F, the first flip-flop having an output connected to an input of the second flip-flop; and
   gate means receiving said clock pulses and an output of said second flip-flop, and delivering alternate control signals to said first flip-flop at every third clock pulse edge for alternately setting and resetting said first flip-flop on alternate inverted third clock pulse edges such that said output of said first flip-flop provides symmetrical pulses of frequency ⅓F with a substantially 50% duty cycle.

6. The invention according to claim 5 wherein said output of said second flip-flop provides pulses of frequency ⅓F with a substantially 67% duty cycle, and the output of said gate means provides said reset control signal at frequency ⅓F with a substantially 17% duty cycle.

7. The invention according to claim 6 wherein the trailing pulse edge terminating the duty portion of a cycle of said reset control signal coincides with the leading pulse edge initiating the duty portion of a cycle of the signal from said output of said second flip-flop.

8. The invention according to claim 7 wherein the leading pulse edge initiating the duty portion of a cycle of said reset control signal coincides with the trailing pulse edge terminating the duty portion of a cycle of the signal from said output of said first flip-flop.

9. The invention according to claim 8 wherein:
said leading pulse edge initiating the duty portion of a cycle of said reset control signal coincident with said trailing pulse edge terminating the duty portion of a cycle of the signal from said output of said first flip-flop is further coincident with a clock pulse edge of one polarity; and
said trailing pulse edge terminating the duty portion of a cycle of said reset control signal coincident with said leading pulse edge initiating the duty portion of a cycle of the signal from said output of said second flip-flop is further coincident with the clock pulse edge immediately following said last mentioned clock pulse edge and of opposite polarity, such that the next leading pulse edge from said output of said first flip-flop initiating the duty portion of the next cycle therefrom is coincident with the next clock pulse edge of said opposite polarity.

* * * * *